(12) United States Patent
Hsu

(10) Patent No.: US 12,035,572 B2
(45) Date of Patent: Jul. 9, 2024

(54) DISPLAY SUBSTRATE AND MANUFACTURING METHOD THEREOF, DISPLAY PANEL

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventor: Minghung Hsu, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/808,840

(22) Filed: Jun. 24, 2022

(65) Prior Publication Data

US 2022/0328583 A1    Oct. 13, 2022

Related U.S. Application Data

(63) Continuation of application No. 16/338,597, filed as application No. PCT/CN2018/103576 on Aug. 31, 2018, now Pat. No. 11,404,502.

(30) Foreign Application Priority Data

Oct. 31, 2017   (CN) .......................... 201711050660.0

(51) Int. Cl.
*H10K 59/122*   (2023.01)
*H10K 71/00*    (2023.01)
*H10K 59/12*    (2023.01)

(52) U.S. Cl.
CPC .......... *H10K 59/122* (2023.02); *H10K 71/00* (2023.02); *H10K 59/1201* (2023.02)

(58) Field of Classification Search
CPC ... H10K 59/122; H10K 59/1201; H10K 71/00
(Continued)

(56) References Cited

U.S. PATENT DOCUMENTS 8,546,820 B2    10/2013   Matsushima
9,691,830 B2    6/2017    Song et al.
(Continued)

FOREIGN PATENT DOCUMENTS

CN    101355097 A    1/2009
CN    102165593 A    8/2011
(Continued)

OTHER PUBLICATIONS

The first Chinese Office Action dated Oct. 7, 2023; Appln. No. 201711050660.0.
(Continued)

*Primary Examiner* — Dzung Tran
(74) *Attorney, Agent, or Firm* — Frank Gao, Esq.

(57) ABSTRACT

A display substrate, a manufacturing method thereof and a display panel are provided. The display substrate includes a base and a pixel defining layer provided on the base, the pixel defining layer includes a plurality of sub-pixel regions, and at least one storage tank defined by the pixel defining layer is provided in each of the plurality of sub-pixel regions, and at an identical height with respect to the base, in a length direction of the storage tank, an end portion of the storage tank and a portion between two end portions of the storage tank differ in wettability to a storage material.

15 Claims, 7 Drawing Sheets

(58) Field of Classification Search
USPC .......................................................... 257/629
See application file for complete search history.

(56) References Cited

U.S. PATENT DOCUMENTS

| | | | | |
|---|---|---|---|---|
| 2005/0116632 | A1* | 6/2005 | Funamoto | H10K 71/421 |
| | | | | 313/506 |
| 2009/0026467 | A1 | 1/2009 | Yanagihara | |
| 2013/0105782 | A1 | 5/2013 | Matsushima | |
| 2015/0001486 | A1* | 1/2015 | Kim | H10K 59/122 |
| | | | | 438/23 |
| 2016/0035802 | A1* | 2/2016 | Wang | H10K 71/00 |
| | | | | 438/34 |
| 2016/0155786 | A1 | 6/2016 | Park et al. | |
| 2016/0247862 | A1 | 8/2016 | Song et al. | |
| 2017/0005149 | A1 | 1/2017 | Park et al. | |
| 2017/0213878 | A1 | 7/2017 | Song et al. | |
| 2018/0261767 | A1 | 9/2018 | Zhao | |

FOREIGN PATENT DOCUMENTS

| | | |
|---|---|---|
| CN | 104167430 A | 11/2014 |
| CN | 207320121 U | 5/2016 |
| CN | 106328675 A | 1/2017 |
| CN | 106601774 A | 4/2017 |
| EP | 3 113 228 A1 | 1/2017 |
| EP | 3113228 A1 | 4/2017 |
| JP | 2009026669 A | 2/2009 |
| JP | 2013-041136 A | 2/2013 |

OTHER PUBLICATIONS

The International Search Report and Written Opinion mailed Nov. 16, 2018: PCT/CN2016/103576.
The Extended European Search Report dated-Aug. 11, 2021; Appln. No. 18857440.4.
USPTO NFOA dated Nov. 17, 2021 in connection with U.S. Appl. No. 16/338,597.
USPTO NOA mailed Mar. 16, 2022 in connection with U.S. Appl. No. 16/388,597.
USPTO Corrected Notice of Allowability in connection with U.S. Appl. No. 16/338,597.

* cited by examiner

DISPLAY SUBSTRATE AND MANUFACTURING METHOD THEREOF, DISPLAY PANEL

The present application is a continuation of U.S. application Ser. No. 16/338,597, filed Apr. 1, 2019, which was the National Stage of International Application No. PCT/CN2018/103576, filed Aug. 31, 2018, which claims priority of Chinese Patent Application No. 201711050660.0 filed on Oct. 31, 2017, the entireties of which are hereby incorporated herein by reference.

TECHNICAL FIELD

At least one embodiment of the present disclosure relates to a display substrate and a manufacturing method thereof, and a display panel.

BACKGROUND

An Organic Light-Emitting Diode (OLED) has advantages such as self-luminescence, wide viewing angle, high contrast, low energy consumption, fast response speed, so an OLED display product is increasingly favored by users.

In an actual process, when a structural layer for emitting light in the OLED is manufactured, it is necessary to provide a storage tank for storing ink including a corresponding material, and then the ink is dried to obtain a corresponding structural layer. However, with respect to a current storage tank structure, in a drying process of the ink, flatness of a formed structural layer is relatively poor, which will affect a performance of an organic light emitting device, and cause poor display of the OLED product.

SUMMARY

At least one embodiment of present disclosure provides a display substrate, which comprises: a base; a pixel defining layer, provided on the base, the pixel defining layer includes a plurality of sub-pixel regions, and at least one storage tank defined by the pixel defining layer is provided in each of the plurality of sub-pixel regions, and at an identical height with respect to the base, in a length direction of the storage tank, an end portion of the storage tank and a portion between two end portions of the storage tank differ in wettability to a storage material.

For example, in the display substrate provided by at least one embodiment of present disclosure, in the length direction of the storage tank, at an identical height with respect to the base, wettability of the end portion of the storage tank to the storage material is stronger than wettability of the portion between the two end portions of the storage tank to the storage material.

For example, in the display substrate provided by at least one embodiment of present disclosure, in the length direction of the storage tank, in a direction from the end portion of the storage tank to a center of the storage tank that is located between the two end portions, at an identical height with respect to the base, the wettability gradually decreases.

For example, in the display substrate provided by at least one embodiment of present disclosure, in the length direction of the storage tank, a height of the end portion of the storage tank is larger than a height of the portion of the storage tank that is located between the two end portions.

For example, in the display substrate provided by at least one embodiment of present disclosure, in the length direction of the storage tank, in the direction from the end portion of the storage tank to the center of the storage tank that is located between the two end portions, a height of the storage tank gradually decreases.

For example, in the display substrate provided by at least one embodiment of present disclosure, a planar shape of the storage tank is a rectangle, the storage tank includes two opposite long side walls and two opposite short side walls, the end portion of the storage tank in the length direction includes the short side wall; or includes the short side wall and a portion of the long side wall that is connected with the short side wall.

For example, in the display substrate provided by at least one embodiment of present disclosure, at an identical height with respect to the base, wettability of two ends of the short side wall to the storage material is weaker than wettability of a portion of the short side wall that is located between the two ends to the storage material.

For example, in the display substrate provided by at least one embodiment of present disclosure, in a direction from the two ends of the short side wall to the portion of the short side wall that is located between the two ends, the height of the storage tank gradually increases.

For example, in the display substrate provided by at least one embodiment of present disclosure, a slope angle of a side surface of the long side wall is larger than a slope angle of a side surface of the short side wall.

For example, in the display substrate provided by at least one embodiment of present disclosure, a planar shape of the storage tank is an ellipse, the ellipse includes two long side walls that are directly connected with and opposite to each other, and the end portions of the storage tank in the length direction include end portions of the two long side walls that are located in the length direction.

For example, in the display substrate provided by at least one embodiment of present disclosure, in the length direction of the storage tank, at an identical height with respect to the base, wettability of the end portion of the storage tank to the storage material is weaker than wettability of the portion between the two end portions of the storage tank to the storage material.

For example, in the display substrate provided by at least one embodiment of present disclosure, in the length direction of the storage tank, in a direction from the end portion of the storage tank to a center of the storage tank that is located between the two end portions, at an identical height with respect to the base, the wettability gradually increases.

For example, in the display substrate provided by at least one embodiment of present disclosure, in the length direction of the storage tank, a height of the end portion of the storage tank is smaller than a height of the portion of the storage tank that is located between the two end portions.

For example, in the display substrate provided by at least one embodiment of present disclosure, in the length direction of the storage tank, in the direction from the end portion of the storage tank to the center of the storage tank that is located between the two end portions, a height of the storage tank gradually increases.

At least one embodiment of the present disclosure provides a display panel, which comprises the display substrate according to any embodiment above.

At least one embodiment of the present disclosure provides a manufacturing method of a display substrate, which comprises: providing a base; and forming an insulating material film of on the base; patterning the insulating material film to form a pixel defining layer, the pixel defining layer including a plurality of sub-pixel regions, and at least one storage tank defined by the pixel defining layer being provided in each of the plurality of sub-pixel regions, and at an identical height with respect to the base, in a length direction of the storage tank, an end portion of the storage tank and a portion between two end portions of the storage tank differ in wettability to a storage material.

For example, in the manufacturing method of a display substrate provided by at least one embodiment of present disclosure, a material for manufacturing the pixel defining layer includes a halogen polymer, and the manufacturing method further comprises: baking the pixel defining layer, so that a portion of the pixel defining layer away from the base becomes a lyophobic layer, and a portion of the pixel defining layer close to the base is transformed into a lyophilic layer.

For example, in the manufacturing method of a display substrate provided by at least one embodiment of present disclosure, a material for manufacturing the pixel defining layer includes a lyophilic photoresist material, and the manufacturing method further comprises: performing plasma treatment on a surface of the pixel defining layer away from the base with a gas including a halogen compound, so that the portion of the pixel defining layer away from the base has a lyophobic property.

For example, the manufacturing method of a display substrate provided by at least one embodiment of present disclosure further comprises: treating a surface of the pixel defining layer with the plasma gas including the halogen compound.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

REFERENCE SIGNS

Figure 1A:
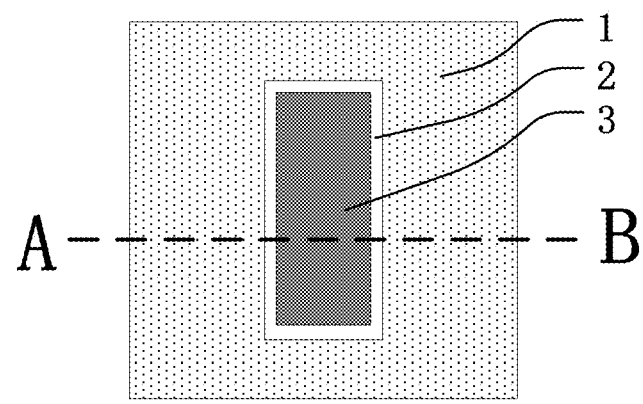
FIG. 1A is a plan view of a storage tank provided with a storage material.

1—pixel defining layer; 2—storage tank; 3—structural layer; 100—base; 200—pixel defining layer; 210—sub-pixel region; 300—storage tank; 310—long side wall; 320—short side wall; 400—organic light emitting device; 410—first electrode; 420—light emitting layer; 430—second electrode; 500—thin film transistor.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

In a manufacturing procedure of an Organic Light-Emitting Diode (OLED), a part of structures in the OLED are usually manufactured by using an inkjet printing method. Exemplarily, a storage tank may be provided in a pixel defining layer, and then ink (including a material that may form a part of structural layers in the OLED) is dropped into the storage tank, which is dried to obtain a corresponding structural layer in the OLED.

However, in an actual process, a shape of the storage tank is usually designed to be rectangular, due to a design structure of a display product such as an aperture ratio. For example, the rectangle is an oblong, ink is distributed differently at interfaces of a long side and a short side of the rectangular storage tank, and accordingly, drying processes of the ink at the long side and the short side of the storage tank are also different from each other. In addition, in the drying process of the ink, as comprehensively affected by various other factors, for example, vacuum degree, temperature, time, material (for example, properties of different materials in the ink) and other process conditions, flatness of the formed structural layer is relatively poor, and a difference in flatness of the structural layer is also different in degree between a length direction and a width direction of the rectangular storage tank.

Figure 1B:
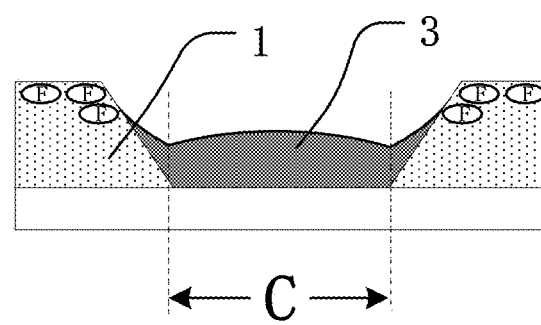
FIG. 1B is a cross-sectional view of the storage tank shown in FIG. 1A taken along A-B.

FIG. 1A is a plan view of a storage tank provided with a storage material, and FIG. 1B is a cross-sectional view of the storage tank shown in FIG. 1A taken along A-B. For example, as shown in FIG. 1A and FIG. 1B, a pixel defining layer 1 defines a shape of a storage tank 2, and a structural layer 3 is formed in the storage tank 2. Usually, a surface layer of the pixel defining layer 1 has a lyophobic property (with reference to F regions in FIG. 1B), and other portion of the pixel defining layer 1 has a lyophilic property, so that ink can be adsorbed in the storage tank 2. In a process of manufacturing the structural layer 3, ink is firstly dropped into the storage tank 2, the ink is a mixed liquid, for example, including a solvent and a solute (the solute may form the structural layer 3), and the solute and the solvent are different in properties such as fluidity, which renders uneven distribution of the solute during an entire drying process, resulting in poor flatness of the structural layer 3.

During the drying process, as the solvent evaporates, a viscosity of the ink increases and a surface tension decreases, and the ink climbs upward at an edge of the storage tank, so that the solvent volatilizes faster at an edge position of the storage tank than in a central region, which causes the ink in the storage tank to flow. If the solute has good fluidity, a large amount of solute will flow with the solvent to the edge of the storage tank during the drying process, and after the drying process, the solute is mainly distributed in an edge region of the storage tank, so that a planar shape of the structural layer is concave. Accordingly, if the solute has poor fluidity, then during the drying process, the solute close to the edge of the storage tank will climb upward along the edge of the storage tank as driven by flow of the solvent, while the solute close to the central region of the storage tank will be retained in a large amount, as shown in FIG. 1B, so that a planar shape of a main body portion of the structural layer 3 located in a C region is convex. The above-described difference in flatness (for example, concave or convex) of the structural layer 3 may result in a defect in an OLED structure. Moreover, as affected by various process factors as described above, the difference in flatness of the formed structural layer may be mainly manifested in a length direction of the storage tank, or may also be manifested in a width direction of the storage tank.

At least one embodiment of the present disclosure provides a display substrate and a manufacturing method thereof, and a display panel. The display substrate comprises: a base; and a pixel defining layer provided on the base, wherein, the pixel defining layer includes a plurality of sub-pixel regions, each sub-pixel region is provided therein with at least one storage tank formed as enclosed by the pixel defining layer; at a same height with respect to the base, in a length direction of the storage tank, an end portion of the storage tank and a portion between two end portions of the storage tank differ in wettability to a storage material.

On a same horizontal plane, respective portions of the storage tank differ in wettability to the storage material; and distribution of wettability in respective regions of the storage tank may be designed according to distribution of the storage material in a drying process, to control an interface of the storage material in the drying process, so as to improve flatness of a structural layer formed of the storage material, and further improve a yield of the display substrate.

Hereinafter, a display substrate and a manufacturing method thereof, and a display panel provided by at least one embodiment of the present disclosure will be described in conjunction with the accompanying drawings.

Figure 2:
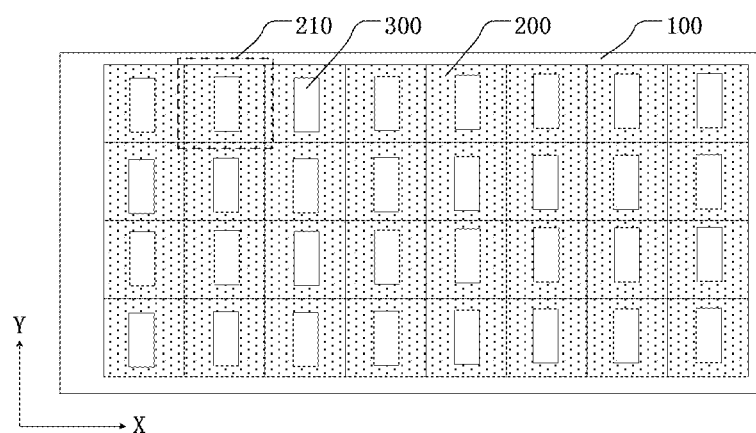
FIG. 2 is a plan view of a display substrate provided by an embodiment of the present disclosure.
Figure 3:
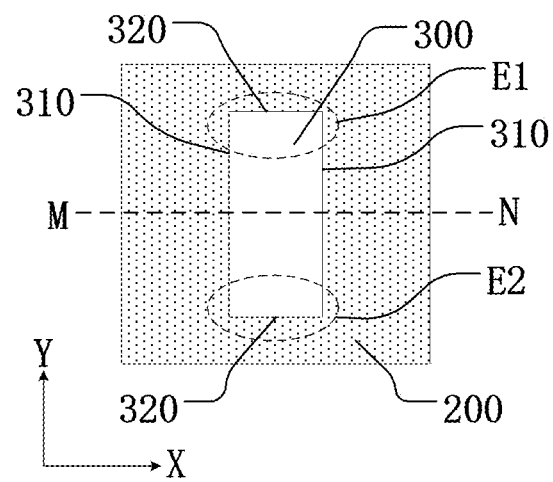
FIG. 3 is a plan view of a sub-pixel region of the display substrate shown in FIG. 2.

FIG. 2 is a plan view of a display substrate provided by an embodiment of the present disclosure, and FIG. 3 is a plan view of one sub-pixel region of the display substrate shown in FIG. 2.

In at least one embodiment of the present disclosure, as shown in FIG. 2 and FIG. 3, the display substrate may comprise a base 100 and a pixel defining layer 200 provided on the base 100, wherein, the pixel defining layer 200 may include a plurality of sub-pixel regions 210, each sub-pixel region 210 is provided therein with at least one storage tank 300 formed as enclosed by the pixel defining layer 200; at a same height with respect to the base 100 (for example, in a same plane parallel to a plane where the base 100 is located), in a length direction of the storage tank 300, an end portion of the storage tank 300 and a portion between two end portions of the storage tank 300 (for example, two opposite end portions E1 and E2 shown in FIG. 3 below) differ in wettability to a storage material.

Distribution of the difference in flatness of a structural layer formed of the storage material is related to a shape of the storage tank. In the embodiment of the present disclosure, a planar shape of the storage tank 300 will not be limited.

For example, in at least one embodiment of the present disclosure, a planar shape of a storage tank may be a rectangle, the storage tank includes two opposite long side walls and two opposite short side walls; an end portion of the storage tank in a length direction includes a short side wall; or includes the short side wall and a portion of the long side wall that is directly connected with the short side wall. In the embodiment of the present disclosure, a length of the portion of the long side wall that is directly connected with the short side wall will not be limited. For example, the length of the portion of the long side wall that is connected with the short side wall may be, for example, ½, ⅓ or ⅕ (which may be any numerical value in a range from 0 to ½) of a half of the long side wall. Exemplarily, as shown in FIG. 3, a rectangular storage tank 300 includes two opposite long side walls 310 and two opposite short side walls 320; an end portion of the storage tank 300 in a length direction includes a short side wall 320; or the end portion of the storage tank 300 in the length direction includes the short side wall 320 and a portion of the long side wall 310 that is directly connected with the short side wall 320 (for example, portions within dashed boxes E1 and E2 in FIG. 3). Hereinafter, technical solutions in the following embodiments of the present disclosure will be described with a case where the planar shape of the storage tank 300 is a rectangle as an example.

Hereinafter, a spatial rectangular coordinate system is established to describe a shape of the storage tank and positions of respective structures in the display substrate. Exemplarily, as shown in FIG. 2 and FIG. 3, an overall extending direction of the two long side walls 310 is set to the length direction of the storage tank 300, and a direction perpendicular to the length direction is a width direction of the storage tank 300. In the spatial rectangular coordinate system, a direction of an X-axis is the width direction of the storage tank, a direction of a Y-axis is the length direction of the storage tank, and a direction of a Z-axis (not shown, with reference to FIG. 4B) is a direction perpendicular to a plane where the base 100 is located.

In an actual process, the difference in flatness (for example, the planar shape is convex or concave) of the structural layer formed of the storage material may be mainly distributed along the X-axis direction (the width direction of the storage tank 300), or may also mainly be distributed along the Y-axis direction (the length direction of the storage tank 300), that is, a difference in flatness in the X-axis direction is relatively great, or a difference in flatness in the Y-axis direction is relatively great. Therefore, in some embodiments of the present disclosure, with respect to a case where a difference in flatness in the X-axis direction is relatively great, a storage tank 300 may be configured to mainly reduce a difference in flatness of a structural layer formed of a storage material in the X-axis direction; in other embodiments, with respect to a case where a difference in flatness in the Y-axis direction is relatively great, a storage tank 300 may be configured to mainly reduce a difference in flatness of a structural layer formed of a storage material in the Y-axis direction.

Hereinafter, a display substrate according to at least one embodiment of the present disclosure will be described according to different arrangement modes of the above-described storage tank 300.

Figure 4A:
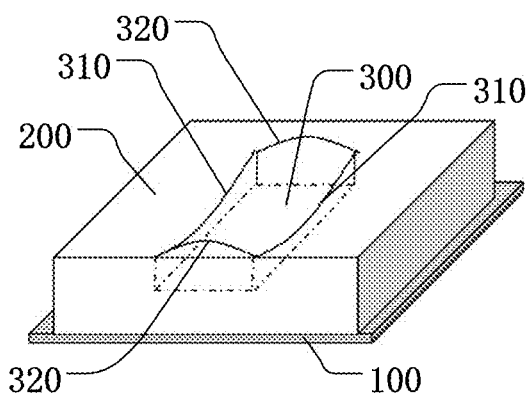
FIG. 4A is a perspective view of a storage tank in the display substrate shown in FIG. 3.
Figure 4B:
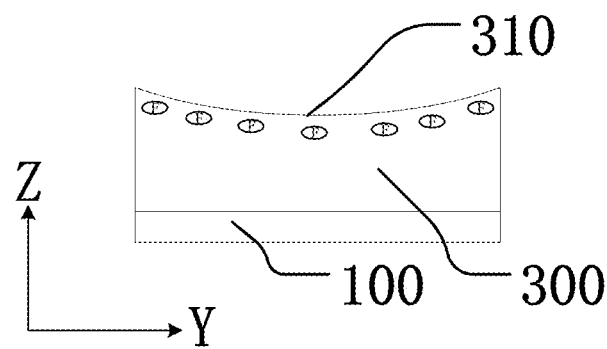
FIG. 4B is a side view of the storage tank in the display substrate shown in FIG. 3.
Figure 4C:
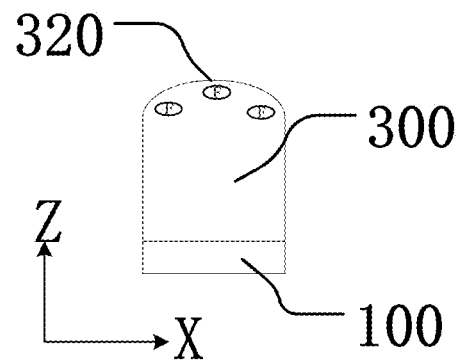
FIG. 4C is a front view of the storage tank in the display substrate shown in FIG. 3.

For example, in at least one embodiment of the present disclosure, a storage tank 300 is configured to mainly reduce a difference in flatness of a storage material in a Y-axis direction, FIG. 4A is a perspective view of the storage tank in the display substrate shown in FIG. 3, FIG. 4B is a side view of the storage tank in the display substrate shown in FIG. 3, and FIG. 4C is a front view of the storage tank in the display substrate shown in FIG. 3.

For example, in at least one embodiment of the present disclosure, in a length direction of a storage tank, at a same height with respect to a base, wettability of an end portion of the storage tank to a storage material is stronger than wettability of a portion between two end portions of the storage tank to the storage material. In the embodiment of the present disclosure, a wettability variation relationship among different portions in the storage tank will not be limited, for example, distribution of wettability may gradually change. For example, in at least one embodiment of the present disclosure, in a length direction of a storage tank, in a direction from an end portion of the storage tank to a center of the storage tank that is located between two end portions, at a same height with respect to a base, wettability gradually decreases. Exemplarily, as shown in FIG. 4A to FIG. 4C, in a direction from a short side wall 320 (or the short side wall 320 and a portion of a long side wall 310 that is directly connected with the short side wall 320) to a center of the long side wall 310, at a same height with respect to the base, wettability of a storage tank 300 to a storage material gradually decreases. The storage tank 300 of the above-described structure can reduce, for example, a climbing ability of the storage material in an intermediate region of the long side wall 310 (a region between the two end portions of the long side wall 310), so as to reduce a flow volume of the storage material towards the intermediate region of the long side wall 310 during an evaporating and drying process of the storage material, which, thus, may improve distribution uniformity of the storage material in a direction of a Y-axis, and ultimately improve flatness of a structure formed of the storage material.

It should be noted that, in at least one embodiment of the present disclosure, distribution of wettability may not gradually change, as long as wettability of an end portion of a storage tank to a storage material is stronger than wettability of a portion between two end portions of the storage tank to the storage material. For example, in at least one embodiment of the present disclosure, wettability of a portion between two end portions of a storage tank may be the same; or partially the same, partially different.

In at least one embodiment of the present disclosure, a mode for implementing a structure of the storage tank 300 as shown in FIG. 4A to FIG. 4C will not be limited. Hereinafter, in several embodiments of the present disclosure, several technical solutions that may implement the structure of the above-described storage tank 300 will be provided.

For example, in at least one embodiment of the present disclosure, in a length direction of a storage tank, a height of an end portion of the storage tank is larger than a height of a portion of the storage tank that is located between two end portions. Exemplarily, as shown in FIG. 4B, a height of a short side wall 320 is larger than a height of a long side wall 310 (regardless of a common boundary where the long side wall 310 and the short side wall 320 are directly connected with each other); or a height of the short side wall 320 and a portion of the long side wall 310 that is directly connected with the short side wall 320 is larger than a height of a remaining portion of the long side wall 310 of the storage tank 300; or a height of an end portion of the long side wall 310 and the short side wall 320 is larger than a height of the remaining portion of the long side wall 310.

For example, in at least one embodiment of the present disclosure, in a length direction of a storage tank, in a direction from an end portion of the storage tank to a center of a portion of the storage tank that is located between two end portions, at a same height with respect to a base, a lyophobic property of the storage tank gradually increases. Exemplarily, as shown in FIG. 4B, at a same height with respect to a base 100, a lyophobic property of a long side wall 310 is stronger than a lyophobic property of a short side wall 320; or a lyophobic property of an intermediate portion of the long side wall 310 is stronger than a lyophobic property of the short side wall 320 and an end portion of the long side wall 310.

For example, after a storage tank 300 having a shape (for example, of a rectangle) as shown in FIG. 4B is formed in a pixel defining layer 200, the pixel defining layer 200 is processed, so that a side of the pixel defining layer 200 away from the base 100 has a lyophobic property, and a side of the pixel defining layer 200 close to the base 100 has a lyophilic property. There may be no clear boundary between a lyophobic property and a lyophilic property in the pixel defining layer 200, and as a distance from the base 100 increases, the pixel defining layer 200 may gradually changes from lyophilic to lyophobic. The height of the end portion of the long side wall 310 is larger than the height of the portion between the two end portions, so at a same height with respect to the base 100, a lyophobic property of the storage tank 300 with respect to the storage material also gradually increases in a direction from the end portion to the center between the two end portions. It should be noted that, the lyophobic property and the lyophilic property are addressed with respect to the storage material. Exemplarily, a lyophobic property gradually increases in the direction from the end portion of the long side wall 310 to the center between the two end portions, which is equivalent to that a lyophilic property gradually decreases in the direction from the end portion of the long side wall 310 to the center between the two end portions.

In at least one embodiment of the present disclosure, a position of a region where a height of a storage tank 300 is the smallest (for example, a portion having a smallest distance from a base 100, at an edge of a long side wall 310 that is away from the base) will not be limited, and the position may be any region located between two end portions of the long side wall 310.

For example, in at least one embodiment of the present disclosure, in a length direction of a storage tank, in a direction from an end portion of the storage tank to a center of the storage tank that is located between two end portions, a height of a side wall of the storage tank gradually decreases. Exemplarily, as shown in FIG. 4B, with respect to each long side wall 310, in a direction from an end portion of the long side wall 310 to a center between two end portions, the height of the side wall of the storage tank gradually decreases, that is, a portion of the storage tank 300 having the smallest height may be located at the center of the long side wall 310.

In at least one embodiment of the present disclosure, a specific implementation mode by which a portion of a pixel defining layer 200 away from a base 100 (for example, a surface of the pixel defining layer 200) has a lyophobic property will not be limited, and specific contents of embodiments below (embodiments about a manufacturing method of a display substrate) may be referred to, which will not be repeated here.

For example, in at least one embodiment of the present disclosure, a storage tank further includes a width direction perpendicular to a length direction (for example, a direction parallel to an X axis); for example, an extending direction of a short side wall of the storage tank may be parallel to the width direction. For example, in at least one embodiment of the present disclosure, at a same height with respect to a base, wettability of both ends of the short side wall to a storage material is weaker than wettability of a portion of the short side wall that is located between the two ends to the storage material. Exemplarily, as shown in FIG. 4C, in a direction parallel to an X-axis, in a direction from an end portion of a short side wall 320 to an intermediate portion (for example, a center) of the short side wall 320, at a same height with respect to a base 100, wettability of a storage tank 300 to a storage material gradually increases. In this way, for example, a climbing ability of the storage material in a region close to a long side wall 310 may be further reduced, so as to further reduce a flow volume of the storage material toward the long side wall 310 during a drying process, which improves distribution uniformity of the storage material in a direction of a Y-axis, and improves flatness of a structure formed of the storage material.

In at least one embodiment of the present disclosure, related description of a solution about a long side walls 310 as shown in FIG. 4B may be referred to for a method for implementing distribution of wettability of a short side wall 320 as shown in FIG. 4C, which will not be repeated here.

For example, in at least one embodiment of the present disclosure, in a direction from both ends of a short side wall to a portion of the short side wall that is located between the two ends, a height of a storage tank gradually increases. Exemplarily, as shown in FIG. 4C, with respect to each short side wall 320, in a direction from an end portion of a short side wall 320 to a center of the short side wall 320, a height of the short side wall 320 gradually increases. For example, in at least one embodiment of the present disclosure, in a direction from both ends of a short side wall to a portion of the short side wall that is located between the two ends, at a same height with respect to a base, a lyophobic property of a storage tank gradually decreases. Exemplarily, as shown in FIG. 4C, with respect to each short side wall 320, in a direction from an end portion of a short side wall 320 to a center of the short side wall 320, at a same height with respect to a base 100, a lyophobic property gradually decreases.

Figure 4D:
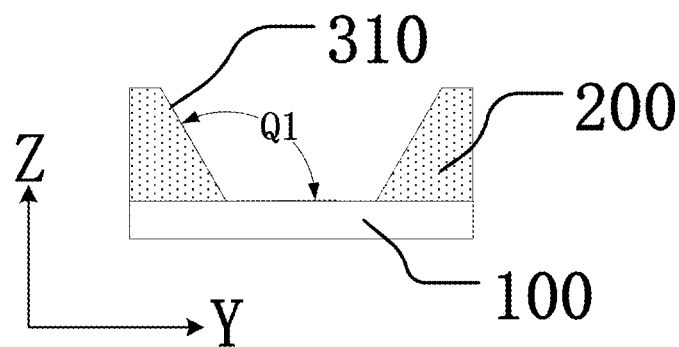
FIG. 4D is a cross-sectional view of the storage tank in the display substrate shown in FIG. 3.
Figure 4E:
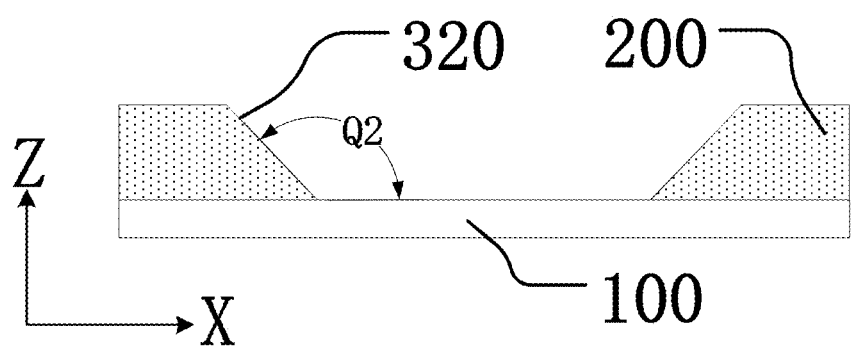
FIG. 4E is another cross-sectional view of the storage tank in the display substrate shown in FIG. 3.

For example, in at least one embodiment of the present disclosure, a slope angle of a side surface of a long side wall is larger than a slope angle of a side surface of a short side wall. FIG. 4D is a cross-sectional view of a storage tank in the display substrate shown in FIG. 3, which is a cross-sectional view of a storage tank 300 along a width direction; and FIG. 4E is another cross-sectional view of the storage tank in the display substrate shown in FIG. 3, which is a cross-sectional view of the storage tank 300 along a length direction. Exemplarily, a slope angle of a long side wall 310 (a slope angle of a side surface at the long side wall 310) is smaller than a slope angle of a short side wall 320 (a slope angle of a side surface at the short side wall 320), that is, the short side wall 320 is steeper than the long side wall 310. For example, as shown in FIG. 4D and FIG. 4E, a slope angle Q1 of the long side wall 310 is an included angle between a plane where the long side wall 310 is located and a plane where a base 100 is located, and a slope angle Q2 of the short side wall 320 is an included angle between a plane where the short side wall 320 is located and a plane where the base 100 is located. As compared with the short side wall 320, the long side wall 310 has a smaller slope angle, so that, for example, a climbing ability of a storage material on the long side wall 310 is weaker than, for example, a climbing ability of the storage material on the short side wall 320, which may further reduce a flow volume of the storage material toward the long side wall 310, and improve flatness of a structure formed of the storage material.

In at least one embodiment of the present disclosure, a degree of a difference between a slope angle Q1 of a long side wall 310 of a storage tank and a slope angle Q2 of a short side wall 320 of the storage tank will not be limited, which may be designed according to actual needs. For example, in at least one embodiment of the present disclosure, a difference between a slope angle Q1 of a long side wall 310 of a storage tank 300 and a slope angle Q2 of a short side wall 320 of the storage tank 300 is no less than 15 degrees. Exemplarily, in a storage tank structure shown in FIG. 4D and FIG. 4E, a value obtained by deducting the slope angle Q1 of the long side wall 310 from the slope angle Q2 of the short side wall 320 is no less than 15 degrees.

It should be noted that, in at least one embodiment of the present disclosure, a mode for forming slope angles of a long side wall 310 and a short side wall 320 of a storage tank 300 will not be limited, and a surface of the long side wall 310 and a surface of the short side wall 320 are not limited to a flat surface as shown in FIG. 4D to FIG. 4E, and may also be an arc surface, and the like.

Figure 4F:
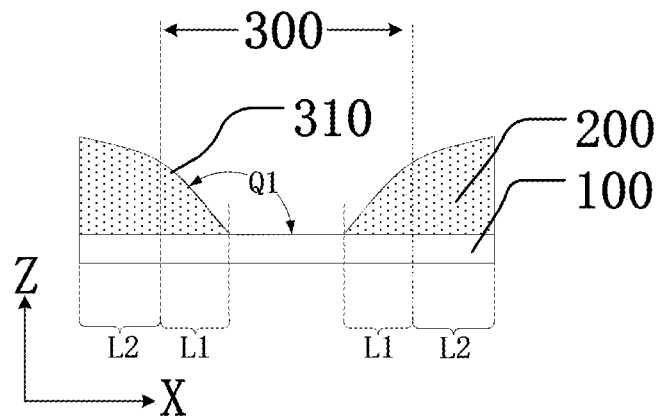
FIG. 4F is another cross-sectional view of the storage tank in the display substrate shown in FIG. 3.

FIG. 4F is another cross-sectional view of a storage tank in the display substrate shown in FIG. 3.

For example, in at least one embodiment of the present disclosure, as shown in FIG. 4F, a storage tank 300 in a pixel defining layer 200 is usually formed by using a photolithographic patterning process with a mask; for example, a mask pattern in the mask may correspond to a position where the storage tank 300 is located. In an exposure process, in an edge region of the mask pattern (corresponding to an L1 region in FIG. 4F), light for exposure may cause a phenomenon such as interference or scattering, resulting in uneven exposure of a photoresist material in the L1 region, which makes a side surface of the storage tank 300, for example, a long side wall 310, to be an oblique surface, while in an actual process, the oblique surface is usually an arc surface. A scattering degree or an interfering degree of light in the L1 region is related to a difference in light transmittance between the mask pattern and a peripheral region (for example, corresponding to an L2 region) of the mask pattern. The greater the difference in the light transmittance between the mask pattern and the peripheral region of the mask pattern, the steeper the formed oblique surface (for example, the long side wall 310 or the short side wall 320), so that an oblique surface, for example, the long side wall 310 or the short side wall 320, having different slope angles may be formed according thereto, which may further allow different portions of the long side walls 310 or the short side walls 320 to have different slope angles. In the embodiment of the present disclosure, the pixel defining layer may be subjected to a photolithographic patterning process by using, for example, a half-mask process, to form a storage tank structure having different shapes, which will not increase a flow of a manufacturing process of a display substrate, as compared with a current manufacturing process of a storage tank.

For example, in at least one embodiment of the present disclosure, a photolithographic patterning process, for example, may include: coating a photoresist layer on a structural layer that needs to be patterned, exposing the photoresist layer with a mask, developing the exposed photoresist layer to obtain a photoresist pattern, etching the structural layer with the photoresist pattern, and then optionally removing the photoresist pattern.

In at least one embodiment of the present disclosure, a material for manufacturing a pixel defining layer 200 will not be limited. For example, in some embodiments of the present disclosure, a pixel defining layer 200 may be made of an insulating material, and contents in the foregoing embodiment may be referred to for a photolithographic patterning process for forming a storage tank 300 in the pixel defining layer 200, which will not be repeated here. For example, in other embodiments of the present disclosure, a material for manufacturing a pixel defining layer 200 may further be a photoresist material (photoresist), and a photolithographic patterning process for forming a storage tank 300 in the pixel defining layer 200 may include: coating a photoresist layer on a base 100, exposing the photoresist layer with a mask, and developing the exposed photoresist layer to obtain the pixel defining layer 200 in which the storage tank 300 is formed.

In at least one embodiment of the present disclosure, a width of a projection (corresponding to an L1 region in FIG. 4F) of a side surface, for example, a long side wall 310, of a storage tank 300 on a base 100 will not be limited. For example, a width of a projection of the long side wall 310 or a short side wall 320 on the base 100 may be about 1 to 15 microns, and may further be about 3 microns.

In the embodiment as shown in FIG. 4A to FIG. 4F in the present disclosure, a height variation relationship between the long side wall 310 and the short side wall 320 (an overall height of the short side wall 320 is larger than an overall height of the long side wall 310) will not be limited. For example, the height variation relationship between the long side wall 310 and the short side wall 320 may gradually change. Exemplarily, from a center of the short side wall 320 to a center of the long side wall 310, a height of an edge of the storage tank 300 away from the base 100 decreases smoothly.

In at least one embodiment of the present disclosure, a height difference between two end portions (for example, long side walls 310) of a storage tank 300 that are located in a width direction and two end portions (for example, short side walls 320) of the storage tank 300 that are located in a length direction will not be limited. For example, in at least one embodiment of the present disclosure, as shown in FIG. 4F, a maximum height difference between a long side wall 310 and a short side wall 320 is no less than about 0.5 microns. Exemplarily, with the storage tank structure as shown in FIG. 4A to FIG. 4F as an example, a difference between a maximum height of the short side wall 320 (for example, a height at a center of the short side wall 320) and a minimum height of the long side wall 310 (for example, a height at a center of the long side wall 310) is no less than about 0.5 microns.

Figure 5A:
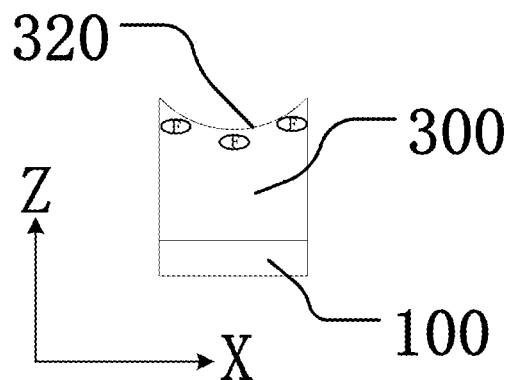
FIG. 5A is a front view of another storage tank in the display substrate shown in FIG. 3.
Figure 5B:
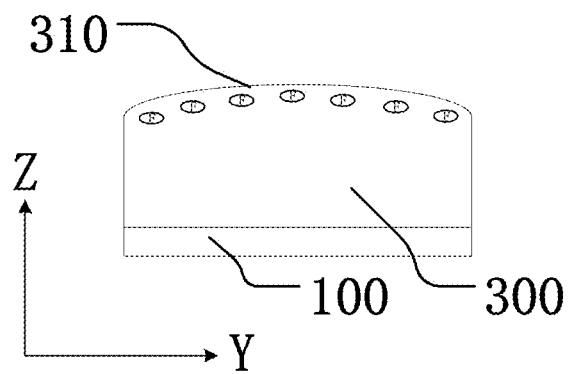
FIG. 5B is a side view of another storage tank in the display substrate shown in FIG. 3.

For example, in at least one embodiment of the present disclosure, a storage tank 300 is configured to mainly reduce the difference in flatness of a storage material in an X-axis direction, FIG. 5A is a front view of another storage tank in the display substrate shown in FIG. 3, and FIG. 5B is a side view of another storage tank in the display substrate shown in FIG. 3.

For example, in at least one embodiment of the present disclosure, in a length direction of a storage tank, at a same height with respect to a base, wettability of an end portion of the storage tank to a storage material is weaker than wettability of a portion between two end portions of the storage tank to the storage material. In the embodiment of the present disclosure, a wettability variation relationship among different portions in the storage tank will not be limited, for example, distribution of wettability may gradually change. For example, in at least one embodiment of the present disclosure, in a length direction of a storage tank, in a direction from an end portion of the storage tank to a center of the storage tank that is located between two end portions, at a same height with respect to a base, wettability of the storage tank gradually increases. Exemplarily, as shown in FIG. 5A and FIG. 5B, in a direction from a short side wall 320 (or the short side wall 320 and a portion of a long side wall 310 that is directly connected with the short side wall 320) to a center of the long side wall 310, at a same height with respect to a base 100, wettability of a storage tank 300 to a storage material gradually increases. The storage tank 300 of the above-described structure can reduce, for example, a climbing ability of the storage material in two end regions of the long side wall 310, so as to reduce a flow volume of the storage material in the two end regions toward the long side wall 310 during an evaporating and drying process of the storage material, which, thus, may improve distribution uniformity of the storage material in a direction of an X-axis, and ultimately improve flatness of a structure formed of the storage material.

In at least one embodiment of the present disclosure, a mode for implementing a structure of a storage tank 300 as shown in FIG. 5A and FIG. 5B will not be limited. Hereinafter, in several embodiments of the present disclosure, several technical solutions that can implement the structure of the above-described storage tank 300 will be provided.

For example, in at least one embodiment of the present disclosure, in a length direction of a storage tank, a height of an end portion of the storage tank is smaller than a height of a portion of the storage tank that is located between two end portions. Exemplarily, as shown in FIG. 5A an FIG. 5B, a height of a short side wall 320 is smaller than a height of a long side wall 310 (regardless of a common boundary which is shared by the long side wall 310 and the short side wall 320); or a height of the short side wall 320 and a portion of the long side wall 310 that is directly connected with the short side wall 320 is smaller than a height of a remaining portion of the long side wall 310 of the storage tank 300; or a height of an end portion of the long side wall 310 and a height of the short side wall 320 is smaller than a height of a remaining portion of the long side wall 310. For example, in the embodiment of the present disclosure, a position of a region where the height of the long side wall 310 is the largest (a portion having a largest distance from a base 100 at an edge of the long side wall 310 that is away from the base) will not be limited, and the position may be any region located between two end portions of the long side wall 310. For example, in at least one embodiment of the present disclosure, with respect to each long side wall 310, in a direction from an end portion to a center of the long side wall 310 that is located between two end portions, a height gradually increases.

For example, in at least one embodiment of the present disclosure, in a length direction of a storage tank, in a direction from an end portion of the storage tank to a portion of the storage tank that is located between two end portions, at a same height with respect to a base, a lyophobic property of the storage tank gradually decreases. Exemplarily, as shown in FIG. 5A and FIG. 5B, at a same height with respect to a base 100, a lyophobic property of a long side wall 310 is weaker than a lyophobic property of a short side wall 320; or a lyophobic property of an intermediate portion of the long side wall 310 is weaker than a lyophobic property of the short side wall 320 and an end portion of the long side wall 310. Related contents in the foregoing embodiments (for example, the embodiment shown in FIG. 4B) may be referred to for a relationship between a shape of the storage tank 300 (for example, a shape of the long side wall 310) and its lyophobic property distribution, which will not be repeated here in the embodiment of the present disclosure.

For example, in at least one embodiment of the present disclosure, a storage tank further includes a width direction perpendicular to a length direction (for example, a direction parallel to an X axis); for example, an extending direction of a short side wall of the storage tank may be parallel to the width direction. For example, in at least one embodiment of the present disclosure, at a same height with respect to a base, wettability of both ends of a short side wall to a storage material is stronger than wettability of a portion of the short side wall that is located between the two ends to the storage material. Exemplarily, as shown in FIG. 5A an FIG. 5B, in a direction from an end portion of a short side wall 320 to an intermediate position (for example, a center) of the short side wall 320, at a same height with respect to a base 100, wettability of a storage tank 300 to a storage material gradually decreases. In this way, for example, a climbing ability of the storage material in a region close to the short side wall 320 may be further reduced, so as to further reduce a flow volume of the storage material toward the short side wall 320 during a drying process, which improves distribution uniformity of the storage material in a direction of an X-axis, and improves flatness of a structure formed of the storage material.

In at least one embodiment of the present disclosure, related description of a solution about a long side wall 310 as shown in FIG. 4B may be referred to for a method for implementing distribution of wettability of a short side walls 320 as shown in FIG. 5A and FIG. 5B, which will not be repeated here.

For example, in at least one embodiment of the present disclosure, in a direction from both ends of a short side wall to a portion of the short side wall that is located between the two ends, a height of a storage tank gradually decreases. Exemplarily, as shown in FIG. 5A and FIG. 5B, with respect to each short side wall 320, in a direction from an end portion of the short side wall 320 to a portion of the short side wall 320 that is located between two ends (for example, a center of the short side wall 320), a height of the side wall gradually decreases. For example, in at least one embodiment of the present disclosure, in a direction from both ends of a short side wall to a portion of the short side wall that is located between the two ends, at a same height with respect to a base, a lyophobic property of a storage tank gradually increases. Exemplarily, as shown in FIG. 5A and FIG. 5B, with respect to each short side wall 320, in a direction from an end portion to a center of the short side wall 320, at a same height with respect to a base 100, a lyophobic property gradually increases. In this way, for example, a climbing ability of a storage material in a central region close to the short side wall 320 may be further reduced, so that a flow volume of the storage material toward the central region at the short side wall 320 may be reduced during a drying process, which improves distribution uniformity of the storage material in a direction of an X-axis, and improves flatness of a structure formed of the storage material.

Figure 5C:
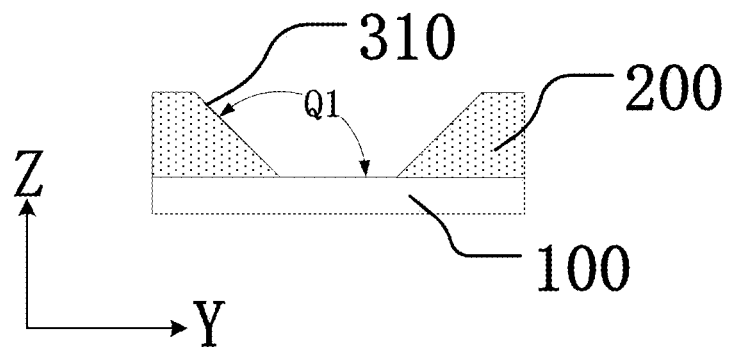
FIG. 5C is a cross-sectional view of another storage tank in the display substrate shown in FIG. 3.
Figure 5D:
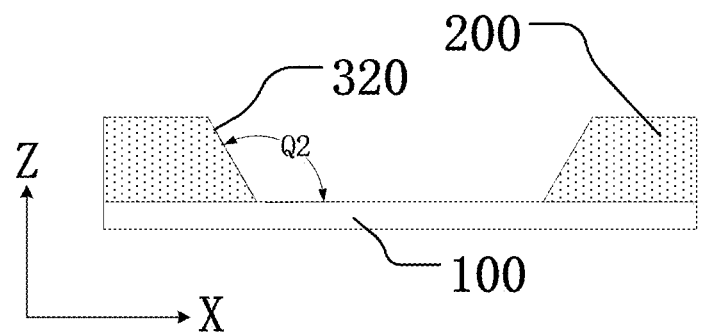
FIG. 5D is another cross-sectional view of another storage tank in the display substrate shown in FIG. 3.

For example, in at least one embodiment of the present disclosure, a slope angle of a side surface of a long side wall is smaller than a slope angle of a side surface of a short side wall. FIG. 5C is a cross-sectional view of another storage tank in the display substrate shown in FIG. 3, which is a cross-sectional view of a storage tank 300 along a width direction; and FIG. 5D is another cross-sectional view of another storage tank in the display substrate shown in FIG. 3, which is a cross-sectional view of the storage tank 300 along a length direction. Exemplarily, a slope angle of a long side wall 310 (a slope angle of a side surface at the long side wall 310) is larger than a slope angle of a short side wall 320 (a slope angle of a side surface at the short side wall 320), that is, the short side wall 320 is steeper than the long side wall 310. For example, as shown in FIG. 5C and FIG. 5D, a slope angle Q1 of the long side wall 310 is an included angle between a plane where the long side wall 310 is located and a plane where a base 100 is located, and a slope angle Q2 of the short side wall 320 is an included angle between a plane where the short side wall 320 is located and a plane where the base 100 is located. As compared with the short side wall 320, the long side wall 310 has a larger slope angle, so that, for example, a climbing ability of a storage material on the short side wall 320 is weaker than, for example, a climbing ability of the storage material on the long side wall 310, which may further reduce a flow volume of the storage material toward the short side wall 320, and improve flatness of a structure formed of the storage material. In this embodiment, related description in the foregoing embodiments (for example, the embodiments shown in FIG. 4D and FIG. 4E) may be referred to for formation of the long side wall 310 and the short side wall 320 in the storage tank 300, a difference in slope angle between the long side wall 310 and the short side wall 320, specific shapes of the long side wall 310 and the short side wall 320, and the like.

In at least one embodiment of the present disclosure, a degree of a difference between a slope angle Q1 of a long side wall 310 of a storage tank and a slope angle Q2 of a short side wall 320 of the storage tank will not be limited, which may be designed according to actual needs. For example, in a storage tank structure shown in FIG. 5C and FIG. 5D, a value obtained by deducting the slope angle Q2 of the short side wall 320 from the slope angle Q1 of the long side wall 310 is no less than 15 degrees.

In at least one embodiment of the present disclosure, a planar shape of a storage tank 300 will not be limited. For example, the planar shape of the storage tank 300 is not limited to a rectangle in FIG. 3, and may also be an ellipse, a polygon, and the like. Hereinafter, a structure of the storage tank 300 according to the embodiment of the present disclosure will be analyzed with a case where the planar shape of the storage tank 300 is an ellipse as an example.

Figure 6:
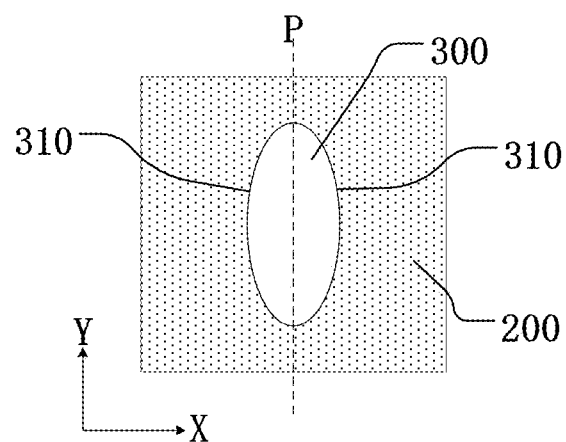
FIG. 6 is a plan view of another sub-pixel region in a display substrate provided by an embodiment of the present disclosure.

For example, in at least one embodiment of the present disclosure, a planar shape of a storage tank is an ellipse, the ellipse includes two long side walls that are connected with and opposite to each other, and end portions of the storage tank in a length direction include end portions of the two long side walls that are located in the length direction. FIG. 6 is a plan view of another sub-pixel region in a display substrate provided by an embodiment of the present disclosure. As shown in FIG. 6, a planar shape of a storage tank 300 located in a pixel defining layer 200 is an ellipse, two long side walls 310 of the storage tank 300 are directly connected with each other and respectively located on both sides of a dashed line P, and the dashed line P may be an extension line of a connection line between two focal points of the ellipse. A direction where the dashed line P is located may be a length direction of the storage tank 300, for example, parallel to a Y axis; a direction perpendicular to the direction where the dashed line P is located may be a width direction of the storage tank 300, for example, parallel to an X axis. For example, in the length direction of the storage tank 300, both ends of the storage tank 300 may include two end portions of the two long side walls 310; and for example, in the width direction of the storage tank 300, both ends of the storage tank 300 may include intermediate portions of the two long side walls 310.

Figure 7A:
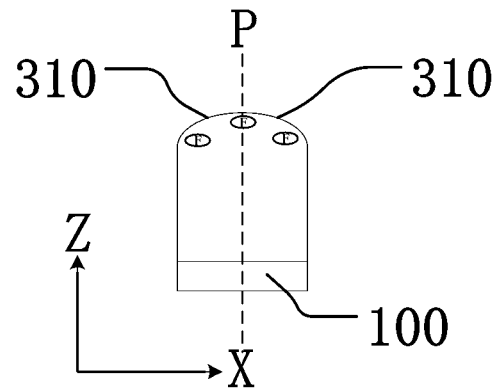
FIG. 7A is a front view of a storage tank in the display substrate shown in FIG. 6.
Figure 7B:
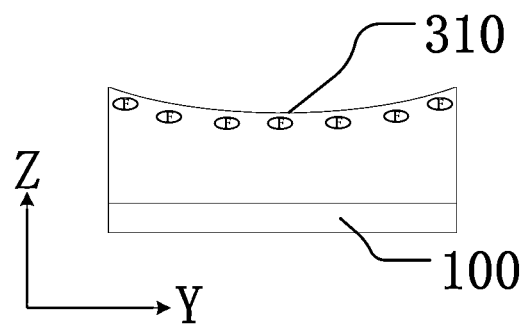
FIG. 7B is a side view of the storage tank in the display substrate shown in FIG. 6.

FIG. 7A is a front view of a storage tank in the display substrate shown in FIG. 6, and FIG. 7B is a side view of a storage tank in the display substrate shown in FIG. 6. As shown in FIG. 7A and FIG. 7B, in the length direction of the storage tank 300, wettability of an end portion of the storage tank 300 to a storage material is stronger than wettability of a portion between two end portions of the storage tank 300 to the storage material. Further, with respect to each long side wall 310, in a direction from the end portion to a center of the long side wall 310 that is located between two end portions, at a same height with respect to a base 100, wettability of the storage tank 300 to the storage material gradually decreases. During an evaporating and drying process of the storage material, the above-described structure of the storage tank 300 may reduce a flow volume of the storage material along an X-axis direction, and may further improve uniformity of distribution of the storage material in a Y-axis direction.

For example, as shown in FIG. 7A and FIG. 7B, in a direction parallel to the Y-axis (the length direction of the storage tank 300), a height of the two end portions of the storage tank 300 is larger than a height of the intermediate portion of the storage tank 300. Further, for example, in the direction parallel to the X-axis (the width direction of the storage tank 300), a height of the elliptical storage tank 300 gradually increases from both ends to the center.

For example, as shown in FIG. 7A and FIG. 7B, in the direction parallel to the Y-axis (the length direction of the storage tank 300), at a same height with respect to the base 100, a lyophobic property of the two end portions of the storage tank 300 is weaker than a lyophobic property of the intermediate portion of the storage tank 300. Further, for example, in the direction parallel to the X-axis (the width direction of the storage tank 300), at a same height with respect to the base 100, a lyophobic property of the elliptical storage tank 300 gradually decreases from two ends to the center.

Related contents in the embodiments shown in FIG. 4B to FIG. 4F may be referred to for related design structures and technical effects of the storage tank 300 shown in FIG. 7A and FIG. 7B, which will not be repeated here in the embodiment of the present disclosure.

For example, in the embodiment shown in FIG. 7A and FIG. 7B, the two long side walls 310 of the elliptical storage tank 300 are directly connected with each other, so a distribution rule of a slope angle of a side surface (the long side wall 310) of the storage tank 300 may be designed such that: in the direction parallel to the Y axis, the slope angle of the long side wall 310 gradually decreases from the two ends of the storage tank 300 to the intermediate region (for example, the center) of the storage tank 300.

Figure 8A:
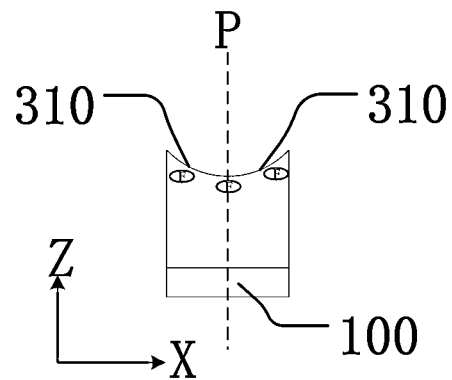
FIG. 8A is a front view of another storage tank in the display substrate shown in FIG. 6.
Figure 8B:
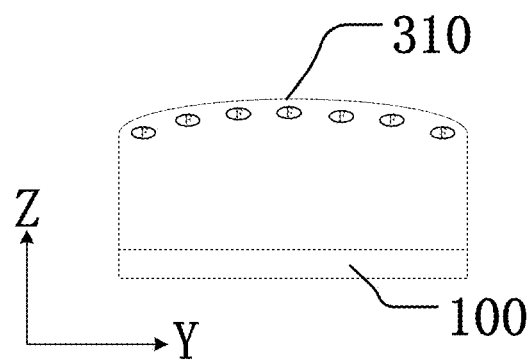
FIG. 8B is a side view of another storage tank in the display substrate shown in FIG. 6.

FIG. 8A is a front view of a storage tank in the display substrate shown in FIG. 6, and FIG. 8B is a side view of the storage tank in the display substrate shown in FIG. 6.

For example, in at least one embodiment of the present disclosure, as shown in FIG. 8A and FIG. 8B, in a length direction of a storage tank 300, wettability of an end portion of the storage tank 300 to a storage material is weaker than wettability of a portion between the two end portions of the storage tank 300 to the storage material. Further, with respect to each long side wall 310, in a direction from the end portion to a center of the long side wall 310 between the two end portions, at a same height with respect to a base 100, wettability of the storage tank 300 to the storage material gradually increases. During an evaporating and drying process of the storage material, the above-described structure of the storage tank 300 may reduce a flow volume of the storage material along a Y-axis direction, and may further improve uniformity of distribution of the storage material in an X-axis direction.

For example, as shown in FIG. 8A and FIG. 8B, in a direction parallel to the Y-axis (the length direction of the storage tank 300), a height of two end portions of the storage tank 300 is smaller than a height of an intermediate portion of the storage tank 300. Further, for example, in a direction parallel to the X-axis (the width direction of the storage tank 300), a height of the elliptical storage tank 300 gradually decreases from both ends to the center.

For example, as shown in FIG. 8A and FIG. 8B, in the direction parallel to the Y-axis (the length direction of the storage tank 300), at a same height with respect to the base 100, a lyophobic property of the two end portions of the storage tank 300 is stronger than a lyophobic property of the intermediate portion of the storage tank 300. Further, for example, in the direction parallel to the X-axis (the width direction of the storage tank 300), at a same height with respect to the base 100, a lyophobic property of the elliptical storage tank 300 gradually increases from both ends to the center.

Related contents in the embodiments shown in FIG. 5A to FIG. 5D may be referred to for related design structures and technical effects of the storage tank 300 shown in FIG. 8A and FIG. 8B, which will not be repeated here in the embodiment of the present disclosure.

For example, in the embodiment shown in FIG. 8A and FIG. 8B, the two long side walls 310 of the elliptical storage tank 300 are directly connected with each other, so a distribution rule of a slope angle of a side surface (the long side wall 310) of the storage tank 300 may be designed such that: in the direction parallel to the Y axis, the slope angle of the long side wall 310 gradually increases from both ends of the storage tank 300 to the intermediate region (for example, the center) of the storage tank 300.

Figure 9:
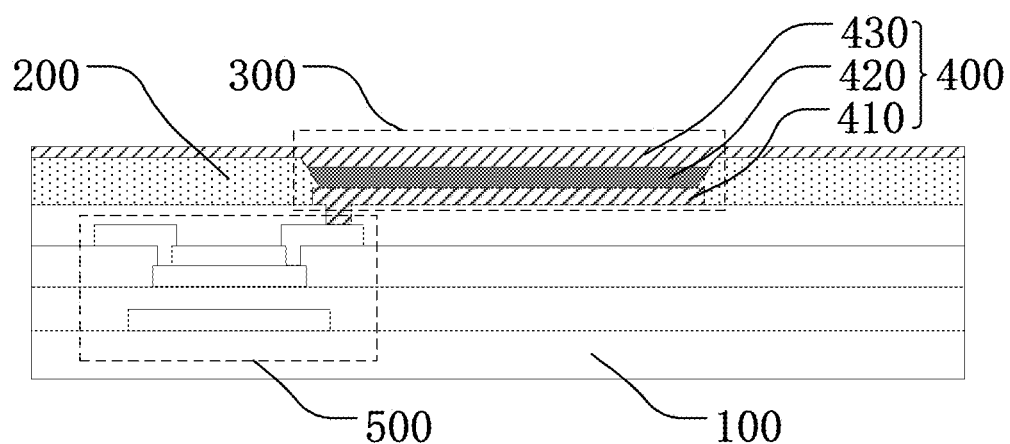
FIG. 9 is a partial structural schematic diagram of a display substrate provided by an embodiment of the present disclosure.

For example, in at least one embodiment of the present disclosure, FIG. 9 is a partial structural schematic diagram of a display substrate provided by the embodiment of the present disclosure. As shown in FIG. 9, the display substrate may further comprise an organic light emitting device 400 provided in a storage tank 300.

In at least one embodiment of the present disclosure, a specific structure of an organic light emitting device 400 will not be limited. For example, the organic light emitting device 400 may include a first electrode 410, a second electrode 430, and an organic light emitting layer 420 located between the first electrode 410 and the second electrode 430. For example, the organic light emitting device 400 may further include a structure such as a hole injection layer, a hole transport layer, an electron transport layer and an electron injection layer. In a process of manufacturing the organic light emitting device 400, a storage material in a storage tank 300 may be configured to form one or a combination of the organic light emitting layer 420, the hole injection layer, the hole transport layer, the electron transport layer and the electron injection layer in the organic light emitting device 400.

In at least one embodiment of the present disclosure, a type of a storage material in a storage tank 300 will not be limited. The storage material may include a solvent and a solute. For example, during a drying process, the solvent evaporates, and the remaining solute forms a structural layer, for example, an organic light emitting layer 420, and the like, in a desired organic light emitting device 400.

In at least one embodiment of the present disclosure, a type of a solvent in a storage material will not be limited. For example, the type of the solvent may be one or a combination of materials below. The type of the solvent may be aromatic hydrocarbons: benzene, toluene, xylene, and the like; aliphatic hydrocarbons: pentane, hexane, octane, and the like; alicyclic hydrocarbons: cyclohexane, cyclohexanone, toluene cyclohexanone, and the like; halogenated hydrocarbons: chlorobenzene, dichlorobenzene, dichloromethane, and the like; alcohols: methanol, ethanol, isopropanol, and the like; ethers: ether, propylene oxide, and the like; esters: methyl acetate, ethyl acetate, propyl acetate, and the like; ketones: acetone, methyl butanone, methyl isobutyl ketone, and the like; diol derivatives: ethylene glycol monomethyl ether, ethylene glycol monoethyl ether, ethylene glycol monobutyl ether, and the like; others: acetonitrile, pyridine, phenol, and the like.

In at least one embodiment of the present disclosure, a type of a solute in a storage material will not be limited, and the type of the solute may be determined by a type of a structural layer in an organic light emitting device 400 to be formed.

For example, in at least one embodiment of the present disclosure, a material for manufacturing an organic light emitting layer 420 may include 8-hydroxyquinoline aluminum, derivatives of 8-hydroxyquinoline aluminum and anthracene, and the like.

For example, in at least one embodiment of the present disclosure, a material for manufacturing a hole injection layer includes phthalocyanine copper, molybdenum trioxide, 4,4',4"-tris(2-naphthylphenyl amino)triphenylamine (2-TNATA), polyaniline, polymer of 3,4-ethylene dioxothiophene monomer (PEDOT), and the like.

For example, in at least one embodiment of the present disclosure, a material for manufacturing a hole transport layer includes poly-phenylene vinylenes, polythiophenes, polysilanes, triphenylmethanes, triarylamines, hydrazones, pyrazolines, chewable azoles, carbazoles, butadienes, and the like.

For example, in at least one embodiment of the present disclosure, a material for manufacturing an electron injection layer includes lithium fluoride, lithium oxide, lithium boron oxide, potassium silicate oxide, cesium carbonate, 8-hydroxyquinoline aluminum-lithium, and the like.

For example, in at least one embodiment of the present disclosure, a material for manufacturing an electron transport layer includes oxazole derivatives, metal chelates, azole compounds, quinoline derivatives, oxaline derivatives, diazoanthracene derivatives, heterocyclic derivatives containing silicon, and the like.

In at least one embodiment of the present disclosure, as shown in FIG. 9, types of a first electrode 410 and a second electrode 430 will not be limited. For example, one of the first electrode 410 and the second electrode 430 may serve as an anode of an organic light emitting device 400, and the other as a cathode of the organic light emitting device 400. For example, a material for manufacturing the anode may include any one of a metal aluminum, a conductive oxide (for example, ITO, IGZO), and the like. For example, a material for manufacturing the cathode includes any one of potassium, lithium, calcium, magnesium, indium or a magnesium aluminum alloy, a magnesium silver alloy and a lithium aluminum alloy. For example, a thin film transistor 500 is further provided in a display substrate of each sub-pixel region; and the thin film transistor 500, for example, may be electrically connected with the first electrode 410, to control an operating state of the organic light emitting device 400.

At least one embodiment of the present disclosure provides a display panel, and the display panel may comprise the display substrate according to any one of the above-described embodiments. For example, the display panel may be applied to a mobile phone, a tablet personal computer, a television, a monitor, a laptop, a digital photo frame, a navigator, and any other product or component having a display function.

At least one embodiment of the present disclosure provides a manufacturing method of a display substrate, the method comprising: providing a base; forming an insulating material film on the base; patterning the insulating material film to form a pixel defining layer, the pixel defining layer including a plurality of sub-pixel regions, and each sub-pixel region being provided therein with at least one storage tank formed as enclosed by the pixel defining layer, wherein, at a same height with respect to the base, in a length direction of the storage tank, an end portion of the storage tank and a portion between two end portions of the storage tank differ in wettability to a storage material. On a same horizontal plane, respective portions of the manufactured storage tank differ in wettability to the storage material; and distribution of wettability in respective regions of the storage tank may be designed according to distribution of the storage material in a drying process, to control an interface of the storage material in the drying process, so as to improve flatness of a structural layer formed of the storage material, and further improve a yield of the manufactured display substrate.

It should be noted that, in at least one embodiment of the present disclosure, related contents in the foregoing embodiments (the embodiments about the display substrate), for example, the embodiments in FIG. 4B to FIG. 4F, or the embodiments in FIG. 5A to FIG. 5D, may be referred to for a structure of a storage tank formed by using the above-described manufacturing method, which will not be repeated here.

For example, in a manufacturing method of a display substrate provided by at least one embodiment of the present disclosure, in a length direction of a storage tank, in a direction from an end portion of the storage tank to a central portion of the storage tank that is located between two end portions, at a same height with respect to a base, wettability gradually decreases or increases. For example, with respect to each long side wall of the manufactured storage tank, as shown in FIG. 4B to FIG. 4C, in a direction from an end portion of a long side wall 310 to a center of the long side wall 310, a height of an edge of the storage tank 300 away from a base 100 gradually decreases. For example, with respect to each long side wall 310 of the manufactured storage tank, as shown in FIG. 5A to FIG. 5B, in a direction from the end portion of the long side wall 310 to the center of the long side wall 310, the height of the edge of the storage tank 300 away from the base 100 gradually increases.

For example, in a manufacturing method of a display substrate provided by at least one embodiment of the present disclosure, a storage tank further includes a width direction perpendicular to a length direction; and in the width direction, in a direction from an end portion of the storage tank to a center of the storage tank that is located between two end portions, at a same height with respect to a base, wettability gradually increases. Exemplarily, the storage tank further includes two opposite short side walls; a length of the short side wall is smaller than a length of a long side wall and two ends of each short side wall are respectively connected with two long side walls; and in a direction from an end portion of the short side wall to a center of the short side wall that is located between two end portions, at a same height with respect to the base, wettability gradually increases or decreases. Related contents in the embodiments in FIG. 4B to FIG. 4C, and the embodiments in FIG. 5A to FIG. 5B may be respectively referred to for related design of a shape of the long side wall and a shape of the short side wall, which will not be repeated here in the embodiment of the present disclosure.

According to a shape of a storage tank 300, a pixel defining layer 200 is processed correspondingly, so that a lyophobic property of the storage tank 300 for a storage material also gradually increases or decreases in the direction from an end portion to a center between two end portions. Hereinafter, description will be provided with several embodiments.

For example, in a manufacturing method of a display substrate provided by at least one embodiment of the present disclosure, a material for manufacturing a pixel defining layer includes a halogen polymer, and the manufacturing method further comprises: baking the pixel defining layer, so that a portion of the pixel defining layer away from a base becomes a lyophobic layer, and a portion of the pixel defining layer close to the base is transformed into a lyophilic layer. For example, the halogen polymer may include fluorine; and after the pixel defining layer is baked, a halogen, for example, fluorine, may aggregate toward a surface of the pixel defining layer, so that the surface of the pixel defining layer has a lyophobic property; in addition, the lyophobic property of the pixel defining layer gradually increases from a position close to the base to the surface of the pixel defining layer. Therefore, the formed storage tank structure may directly allow lyophobic property distribution in the storage tank to meet requirements.

For example, in a manufacturing method of a display substrate provided by at least one embodiment of the present disclosure, a material for manufacturing a pixel defining layer includes a lyophilic photoresist material, and the manufacturing method further comprises: performing plasma treatment on a surface of the pixel defining layer away from a base with a gas including a halogen compound, so that a portion of the pixel defining layer away from the base has a lyophobic property. Thus, from a position close to the base to the surface of the pixel defining layer, a content of the halogen compound gradually increases, and the lyophobic property of the pixel defining layer also gradually increases.

In at least one embodiment of the present disclosure, a type of a gas including a halogen compound will not be limited. For example, the halogen compound may be one or a combination of carbon tetrafluoride, sulfur tetrafluoride or nitrogen trifluoride, and the like.

With respect to different storage tank structures, lyophobic property distribution in the storage tank is also different, and related contents in the embodiments in FIG. 4B to FIG. 4C, and the embodiments in FIG. 5A to FIG. 5B may be respectively referred to for related contents, which will not be repeated here in the embodiment of the present disclosure.

For example, in a manufacturing method of a display substrate provided by at least one embodiment of the present disclosure, a surface of a pixel defining layer may be treated with a plasma gas including a halogen compound. Thus, according to a structure of a storage tank, a difference in wettability among respectively regions of the storage tank on a same horizontal plane may be increased, and in a drying process of a storage material, an ability of the storage tank to adjust an interface of the storage material may be further improved, to improve flatness of a structural layer manufactured from the storage material. For example, with a storage tank structure shown in FIG. 4B to FIG. 4E as an example, on a same horizontal plane, a lyophobic property of a long side wall 310 is stronger than a lyophobic property of a short side wall 320; after the above-described plasma gas treatment, the lyophobic property of the long side wall 310 is still stronger than the lyophobic property of the short side wall 320; and a difference between the two increases. In this way, as compared with a region at the short side wall 320, a flow volume of the storage material toward the long side wall 310 may be further reduced, which may further improve distribution uniformity of the storage material in a direction of a Y-axis, and ultimately further improve flatness of a structure formed of the storage material.

For example, a manufacturing method of a display substrate provided by at least one embodiment of the present disclosure, as shown in FIG. 9, further comprises forming an organic light emitting device 400 in a storage tank 300. Related contents in the foregoing embodiment (the embodiment related to the display substrate shown in FIG. 9) may be referred to for a specific structure of the organic light emitting device 400, which will not be repeated here in the embodiment of the present disclosure.

Exemplarily, after manufacturing of the storage tank 300 is completed, a storage material may be dropped into the storage tank and then dried to obtain a structural layer in the organic light emitting device 400. Sub-pixel regions in the display substrate may be respectively three types: i.e., a red sub-pixel, a green sub-pixel and a blue sub-pixel; after a hole injection layer and a hole transport layer or an electron injection layer and an electron transport layer are simultaneously manufactured in storage tanks of different sub-pixel regions, organic light emitting layers of three light-emitting colors of red, green and blue may be respectively manufactured in the storage tanks of sub-pixel regions of different types. For example, the storage material may also be respectively dropped in a storage tank of each sub-pixel region of the display substrate, to obtain a structural layer in the organic light emitting device 400.

At least one embodiment of the present disclosure provides a display substrate and a manufacturing method thereof, and a display panel, and may have at least one advantageous effect below:

(1) At least one embodiment of the present disclosure provides a display substrate, wherein, on a same horizontal plane, respective portions of a storage tank differ in wettability to a storage material; and distribution of wettability in respective regions of the storage tank may be designed according to distribution of the storage material in a drying process, to control an interface of the storage material in the drying process, so as to improve flatness of a structural layer formed of the storage material.

(2) In a display substrate provided by at least one embodiment of the present disclosure, in a length direction of a storage tank, in a direction from two end portions to an intermediate region, wettability of the storage tank to a storage material gradually decreases, which may improve distribution uniformity of the storage material in the length direction of the storage tank, and ultimately increase flatness of a structure formed of the storage material.

(3) In a display substrate provided by at least one embodiment of the present disclosure, in a length direction of a storage tank, in a direction from two end portions to an intermediate region, wettability of the storage tank to a storage material gradually increases, which may improve distribution uniformity of the storage material in a width direction of the storage tank, and ultimately increase flatness of a structure formed of the storage material.

For the present disclosure, the following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged, that is, the accompanying drawings are not drawn according to the actual scale.

(3) In case of no conflict, features in one embodiment or in different embodiments can be combined to obtain a new embodiment.

What are described above is related to the specific embodiments of the disclosure only and not limitative to the scope of the disclosure. The protection scope of the disclosure shall be based on the protection scope of the claims.

The invention claimed is:

1. A display substrate, comprising
a base;
a pixel defining layer, provided on the base, the pixel defining layer including a plurality of sub-pixel regions, and at least one storage tank defined by the pixel defining layer being provided in each of the plurality of sub-pixel regions,
wherein a planar shape of the storage tank is an ellipse, the ellipse includes two long side walls that are directly connected with and opposite to each other, and end portions of the storage tank in the length direction include end portions of the two long side walls that are located in the length direction,
wherein, at an identical height with respect to the base, in a length direction of the storage tank, a surface of two opposite short side walls of the storage tank and a surface of a side wall between the two opposite short side walls of the storage tank differ in wettability to a storage material.

2. The display substrate according to claim 1, wherein, in the length direction of the storage tank, at an identical height with respect to the base, wettability of a surface of the end portion of the storage tank to the storage material is stronger than wettability of the surface of the side wall between the end portions of the storage tank to the storage material.

3. The display substrate according to claim 2, wherein, in the length direction of the storage tank, in a direction from the end portion of the storage tank to a center of the side wall the storage tank that is located between the end portions, at an identical height with respect to the base, the wettability of the surface of the tank facing the storage material gradually decreases.

4. The display substrate according to claim 2, wherein, in the length direction of the storage tank, a height of the end portion of the storage tank is larger than a height of the side wall of the storage tank that is located between the end portions.

5. The display substrate according to claim 4, wherein, in the length direction of the storage tank, in the direction from the end portion of the storage tank to the center of the side wall of the storage tank that is located between the end portions, a height of the storage tank gradually decreases.

6. The display substrate according to claim 1, wherein, in the length direction of the storage tank, at an identical height with respect to the base, wettability of a surface of the end portion of the storage tank to the storage material is weaker than wettability of a surface of the side wall between the end portions of the storage tank to the storage material.

7. The display substrate according to claim 6, wherein, in the length direction of the storage tank, in a direction from the end portion of the storage tank to a center of the side wall of the storage tank that is located between the end portions, at an identical height with respect to the base, the wettability of the surface of the tank facing the storage material gradually increases.

8. The display substrate according to claim 6, wherein, in the length direction of the storage tank, a height of the end portion of the storage tank is smaller than a height of the side wall of the storage tank that is located between the end portions.

9. The display substrate according to claim 8, wherein, in the length direction of the storage tank, in the direction from the end portion of the storage tank to the center of the side wall of the storage tank that is located between the end portions, a height of the storage tank gradually increases.

10. The display substrate according to claim 3, wherein, in the length direction of the storage tank, a height of the end portion of the storage tank is larger than a height of the side wall of the storage tank that is located between the end portions.

11. A display panel, comprising the display substrate, wherein the display substrate comprises:
- a base;
- a pixel defining layer, provided on the base, the pixel defining layer including a plurality of sub-pixel regions, and at least one storage tank defined by the pixel defining layer being provided in each of the plurality of sub-pixel regions,
- wherein a planar shape of the storage tank is an ellipse, the ellipse includes two long side walls that are directly connected with and opposite to each other, and end portions of the storage tank in the length direction include end portions of the two long side walls that are located in the length direction,
- wherein, at an identical height with respect to the base, in a length direction of the storage tank, a surface of two opposite short side walls of the storage tank and a surface of a side wall between the two opposite short side wall of the storage tank differ in wettability to a storage material.

12. A manufacturing method of a display substrate, comprising:
- providing a base; and
- forming an insulating material film of on the base;
- patterning the insulating material film to form a pixel defining layer, the pixel defining layer including a plurality of sub-pixel regions, and at least one storage tank defined by the pixel defining layer being provided in each of the plurality of sub-pixel regions,
- wherein a planar shape of the storage tank is an ellipse, the ellipse includes two long side walls that are directly connected with and opposite to each other, and end portions of the storage tank in the length direction include end portions of the two long side walls that are located in the length direction,
- wherein, at an identical height with respect to the base, in a length direction of the storage tank, a surface of two opposite short side walls of the storage tank and a surface of a side wall between the two opposite short side walls of the storage tank differ in wettability to a storage material.

13. The manufacturing method of the display substrate according to claim 12, wherein, a material for manufacturing the pixel defining layer includes a halogen polymer, and the manufacturing method further comprises:
- baking the pixel defining layer, so that a portion of the pixel defining layer away from the base becomes a lyophobic layer, and a portion of the pixel defining layer close to the base is transformed into a lyophilic layer.

14. The manufacturing method of the display substrate according to claim 12, wherein, a material for manufacturing the pixel defining layer includes a lyophilic photoresist material, and the manufacturing method further comprises:
- performing plasma treatment on a surface of the pixel defining layer away from the base with a plasma gas including a halogen compound, so that the portion of the pixel defining layer away from the base has a lyophobic property.

15. The manufacturing method of the display substrate according to claim 13, further comprising:
- treating a surface of the pixel defining layer with the plasma gas including the halogen compound.

* * * * *